(12) United States Patent
Hill et al.

(10) Patent No.: US 11,664,197 B2
(45) Date of Patent: May 30, 2023

(54) METHOD AND APPARATUS FOR PLASMA GENERATION

(71) Applicant: MKS Instruments, Inc., Andover, MA (US)

(72) Inventors: Gordon Hill, Andover, MA (US);
Andrew Cowe, Andover, MA (US);
Ron Collins, Andover, MA (US);
Larry Bourget, Andover, MA (US)

(73) Assignee: MKS Instruments, Inc., Andover, MA (US)

( * ) Notice: Subject to any disclaimer, the term of this patent is extended or adjusted under 35 U.S.C. 154(b) by 27 days.

(21) Appl. No.: 17/391,724

(22) Filed: Aug. 2, 2021

(65) Prior Publication Data
US 2023/0036853 A1 Feb. 2, 2023

(51) Int. Cl.
*H01J 37/32* (2006.01)
*C23C 16/50* (2006.01)
*C23C 16/44* (2006.01)

(52) U.S. Cl.
CPC .... *H01J 37/32541* (2013.01); *C23C 16/4405* (2013.01); *C23C 16/50* (2013.01); *H01J 37/32577* (2013.01); *H01J 37/32862* (2013.01)

(58) Field of Classification Search
CPC ........... H01J 37/32541; H01J 37/32577; H01J 37/32862; C23C 16/4405; C23C 16/50
See application file for complete search history.

(56) References Cited

U.S. PATENT DOCUMENTS

| 5,187,072 A | 2/1993 | Cullimore et al. |
| 5,517,786 A | 5/1996 | Peissig |
| 5,637,279 A | 6/1997 | Besen et al. |

(Continued)

FOREIGN PATENT DOCUMENTS

| EP | 2312612 B1 | 3/2017 |
| GB | 2461816 A | 1/2010 |

(Continued)

OTHER PUBLICATIONS http://www.appliedmaterials.com/products/aeris-si, 3 pgs.
(Continued)

*Primary Examiner* — Erin F Bergner
(74) *Attorney, Agent, or Firm* — Cesari and McKenna, LLP

(57) ABSTRACT

A plasma source is provided that includes a body defining an input port, an output port, and at least one discharge section extending along a central longitudinal axis between the input port and the output port. The at least one discharge section includes a return electrode defining a first generally cylindrical interior volume having a first interior diameter, a supply plate comprising a supply electrode, the supply plate defining a second generally cylindrical interior volume having a second interior diameter, and at least one spacer defining a third generally cylindrical interior volume having a third interior diameter. The third interior diameter is different from the first or second interior diameter. The at least one discharge section is formed from the spacer arranged between the return electrode and the supply plate along the central longitudinal axis to define a generally cylindrical discharge gap for generating a plasma therein.

26 Claims, 6 Drawing Sheets

(56) References Cited

U.S. PATENT DOCUMENTS

| | | |
|---|---|---|
| 5,707,451 A | 1/1998 | Robles et al. |
| 5,812,403 A | 9/1998 | Fong et al. |
| 5,827,370 A | 10/1998 | Gu |
| 6,156,667 A | 12/2000 | Jewett |
| 6,187,072 B1 | 2/2001 | Cheung et al. |
| 6,193,802 B1 | 2/2001 | Pang et al. |
| 6,255,222 B1 | 7/2001 | Xia et al. |
| 6,354,241 B1 | 3/2002 | Tanaka et al. |
| 6,360,685 B1 | 3/2002 | Xia et al. |
| 6,366,346 B1 | 4/2002 | Nowak et al. |
| 6,517,786 B1 | 2/2003 | Best et al. |
| 6,680,420 B2 | 1/2004 | Pang et al. |
| 7,037,376 B2 | 5/2006 | Harvey et al. |
| 7,060,234 B2 | 6/2006 | Pokhama et al. |
| 7,494,628 B2 | 2/2009 | Pokhama et al. |
| 7,964,040 B2 | 6/2011 | Rasheed et al. |
| 8,747,762 B2 | 6/2014 | Dickinson et al. |
| 8,852,520 B2 | 10/2014 | Hur et al. |
| 9,314,824 B2 | 4/2016 | Gu et al. |
| 9,472,381 B2 | 10/2016 | Hur et al. |
| 9,597,634 B2 | 3/2017 | Dickinson et al. |
| 9,649,592 B2 | 5/2017 | Cox et al. |
| 9,867,238 B2 | 1/2018 | Cox et al. |
| 10,115,571 B2 | 10/2018 | Dickinson |
| 10,179,941 B1 | 1/2019 | Khan et al. |
| 10,187,966 B2 | 1/2019 | Wang et al. |
| 10,337,105 B2 | 7/2019 | Hill |
| 10,535,506 B2 | 1/2020 | Hill et al. |
| 11,024,489 B2 | 6/2021 | Hill et al. |
| 2003/0007910 A1 | 1/2003 | Diamant Lazarovich et al. |
| 2003/0027428 A1 | 2/2003 | Ng et al. |
| 2004/0001787 A1 | 1/2004 | Porshnev et al. |
| 2004/0131513 A1 | 7/2004 | Lazarovich et al. |
| 2005/0011445 A1 | 1/2005 | Upham |
| 2005/0194099 A1 | 9/2005 | Jewett et al. |
| 2006/0107973 A1 | 5/2006 | Leung |
| 2006/0207630 A1 | 9/2006 | Sakai et al. |
| 2007/0095282 A1 | 5/2007 | Moon et al. |
| 2007/0286766 A1 | 12/2007 | Choi |
| 2008/0057726 A1 | 3/2008 | Kim |
| 2009/0196765 A1 | 8/2009 | Dyer et al. |
| 2010/0192542 A1 | 8/2010 | Min et al. |
| 2011/0089017 A1 | 4/2011 | Hur et al. |
| 2011/0272592 A1 | 11/2011 | Kellogg et al. |
| 2013/0087287 A1 | 4/2013 | Hur et al. |
| 2013/0133697 A1 | 5/2013 | Stockman et al. |
| 2013/0146225 A1 | 6/2013 | Chen et al. |
| 2013/0164943 A1 | 6/2013 | Koshi et al. |
| 2015/0129047 A1 | 5/2015 | Gu et al. |
| 2015/0252472 A1 | 9/2015 | Ko et al. |
| 2015/0252473 A1 | 9/2015 | Dickinson |
| 2015/0314233 A1 | 11/2015 | Hur et al. |
| 2017/0173521 A1 | 6/2017 | Dickinson et al. |
| 2017/0200591 A1* | 7/2017 | Hill ......................... F16K 1/22 |
| 2017/0221683 A1 | 8/2017 | Kim et al. |
| 2020/0286712 A1 | 9/2020 | Polak et al. |
| 2021/0082672 A1 | 3/2021 | Hill et al. |

FOREIGN PATENT DOCUMENTS

| | | |
|---|---|---|
| JP | H11222680 A | 8/1982 |
| JP | H0226804 A | 1/1990 |
| JP | H08-183107 | 7/1996 |
| JP | H10168574 A | 6/1998 |
| JP | H11222680 A | 8/1999 |
| JP | 2005175460 A | 6/2005 |
| JP | 2005303255 A | 10/2005 |
| JP | 2010234195 A | 10/2010 |
| JP | 2010247126 A | 11/2010 |
| JP | 2013-519188 | 5/2013 |
| JP | 2013089537 A | 5/2013 |
| JP | 2015-213171 A | 11/2015 |
| KR | 1020090028991 A | 3/2009 |
| WO | 00/51714 A1 | 9/2000 |
| WO | 2009097068 A1 | 8/2009 |
| WO | 2009097068 A1 | 8/2011 |
| WO | 2011092186 A1 | 8/2011 |
| WO | 2014-062006 A1 | 4/2014 |
| WO | 2015160057 A1 | 10/2015 |
| WO | 2015181945 A1 | 12/2015 |
| WO | 2015/181945 | 4/2017 |

OTHER PUBLICATIONS http://www.appliedmaterials.com/products/aeris-g-plasma-abatement-system, 4 pgs.

Hur min et al. "AC Low-pressure Plasmas Generated by Using Annular-shaped Electrodes for Abatement of Pollutants Emitted during Semiconductor Manufacturing Processs," Journal of the Korean Physical Society, vol. 59, No. 4, Oct. 14, 2011, pp. 2742-2749.

http://www.appliedmaterials.com/nanochip/nanochip-fab-solutions/july-2016/new-aeris-s-technology-helps-increase-subfab-safety-while-reducing-emissions, 6 pgs.

http://www.appliedmaterials.com/products/aeris-si, 3 pgs., date: 2021.

http://www.appliedmaterials.com/products/aeris-g-plasma-abatement-system, 4 pgs., date: 2021.

"Notification of Transmittal of the International Search Report and the Written Opinion of the International Searching Authority, or the Declaration," International Filing Date: Jul. 26, 2022, International Application No. PCT/US2022/074132 Applicant: MKS Instruments, Inc., dated Nov. 14, 20202, pp. 1-10.

* cited by examiner

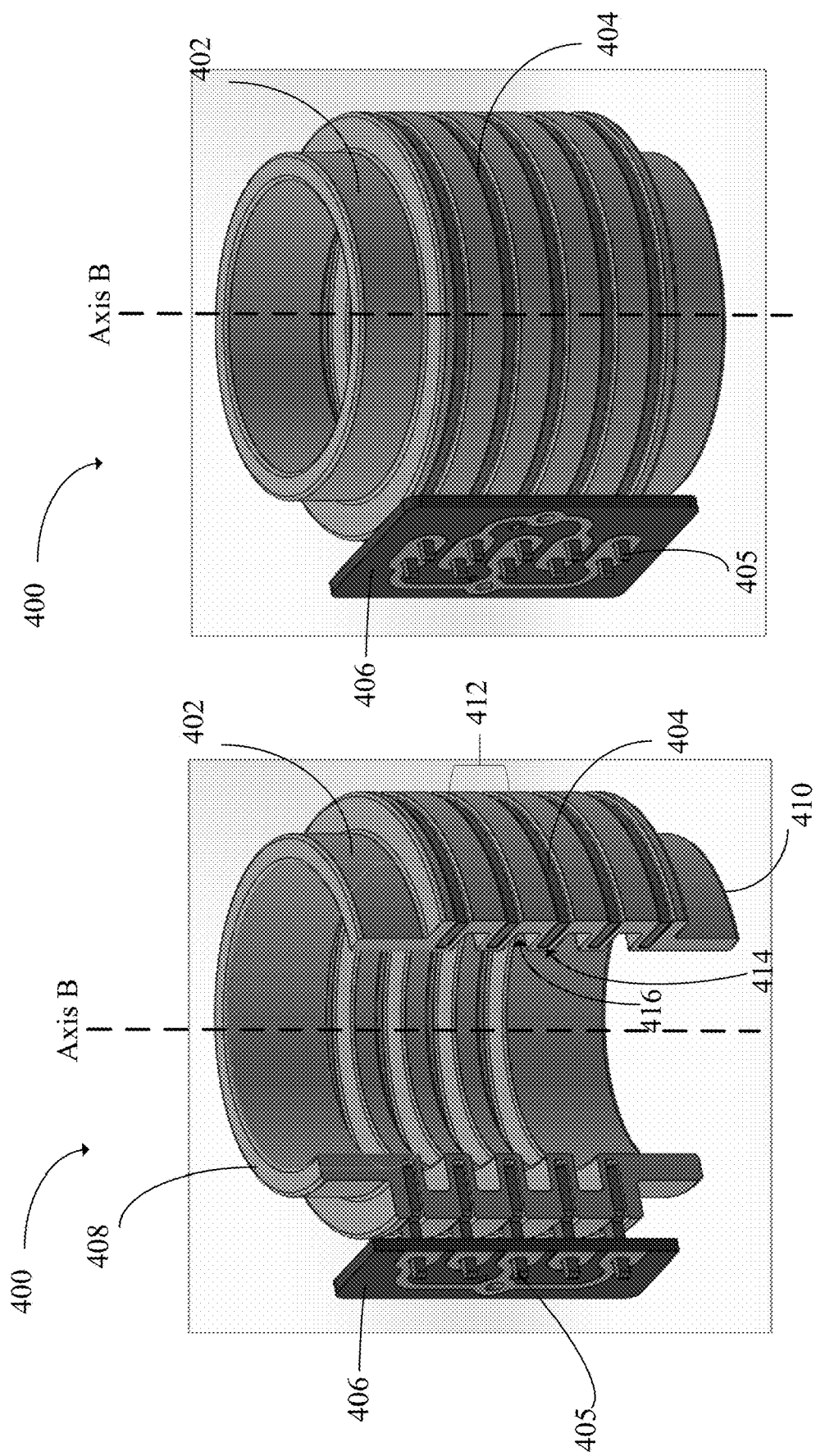

METHOD AND APPARATUS FOR PLASMA GENERATION

FIELD OF THE INVENTION

The invention generally relates to a plasma source configured to generate one or more regions of localized plasmas within the plasma source.

BACKGROUND

Deposition processes, including chemical vapor deposition (CVD) processes, are commonly used in the manufacturing of semiconductor devices. For example, in a typical CVD process, reactant gases are introduced into a reaction chamber and directed to a heated substrate to induce controlled chemical reactions, which result in the deposition of a thin film on the surface of the substrate. During the deposition process, chamber pressure is precisely controlled by one or more mechanical devices, such as vacuum valves, connected downstream from the reaction chamber. For example, an isolation valve is typically connected directly to the exhaust gas port of the reaction chamber, a throttle valve is situated downstream from the isolation valve, and a vacuum pump is located further downstream from both of the isolation and throttle valves. The plumbing between the reaction chamber and the vacuum pump (e.g., the pipelines and valves) is generally referred to as a foreline, a roughing line or a vacuum pumping line.

During a deposition, process, the throttle valve can cycle between open and closed positions to regulate the gas pressure inside of the reaction chamber. Most of the material produced from the reactant gases is deposited on the substrate surface in the reaction chamber. However, some material is also deposited on surfaces outside of the reaction chamber, such as on the throttle valve. As unwanted material accumulates on the throttle valve, the throttle valve's useful life can be reduced by, for example, introduction of seal wear, load addition, requirement for high torque drive systems, and alteration of conductance characteristics. Ultimately, unwanted material deposits on a throttle valve diminish the precise operation of the valve, thereby reducing the valve's ability to control gas pressure inside of the reaction chamber. Other vacuum valves along the vacuum pumping line can be similarly affected by unwanted material deposition. In addition, the position of a throttle valve during closed loop pressure control can provide useful diagnostic information. However, because valve position varies with quantity of deposition, unwanted deposition on a valve can limit the usefulness of valve positioning as an indication of other changes in the system.

Typically, an operator needs to manually remove valves in a mechanical system for cleaning or replacement. This requires downtime of the tool and venting of the foreline plumbing. Alternatively, remote plasma sources have been used for pump and foreline cleaning, where the plasma output is directed at the foreline, but not so close to the valves as to provide optimized and targeted component cleaning.

Further, during a wafer deposition process, unwanted material produced from the reactant gases can also be deposited along the vacuum pumping line as the reactant gases are pumped out from the processing chamber through the pumping line. Similar to the throttle valve, accumulation of the unwanted material in the vacuum pumping line can produce a host of problems, including clogging the pumping line and other downstream equipment, interfering with normal operation of the associated vacuum pump, reducing the vacuum pump's useful life, and contaminating processing steps in the processing chamber.

it is known that cylindrical plasma generators are available for valve/pumping line cleaning, but the discharge gap of these devices is along the longitudinal axis of the cylindrical structures and the resulting discharge current is parallel to both the supply (e.g., powered) electrode and return (e.g., grounded) electrode of the structures. More specifically, in these devices, the supply and return electrodes are typically parallel to the gas flow direction and the discharge gap is not clearly defined. Therefore, most of the resulting discharge current concentrates at the edge of the supply electrode where the voltage tends to be the lowest and the total energy is minimized. This produces concentrated erosion of the supply electrode at its edge. Other known plasma generators have limited conductance due to a lack of line of sight between the input and output ports of the generator (e.g., a labyrinth structure), manufacturing complexity due to complexity in structure and/or material composition, and usage of inductive coupling for plasma generation which may have difficulty igniting plasma.

SUMMARY

Therefore, there is a need for a plasma generator capable of producing plasma based on capacitive discharge, where the generator includes one or more substantially uniform discharge gaps configured to produce substantially uniform current density therein. In some embodiments, a plasma generator described herein is suitably configured for integration with a pumping line to create a localized plasma at one or more target locations where deposition is problematic for the pumping line. For example, the plasma generator can be a pipe-shaped structure with maximized pumping conductance.

In one aspect, a plasma source is provided that includes a body defining an input port, an output port, and at least one discharge section extending along a central longitudinal axis between the input port and the output port. The at least one discharge section includes a return electrode defining a first generally cylindrical interior volume having a first interior diameter disposed perpendicular to the central longitudinal axis and a supply plate comprising a supply electrode. The supply plate defines a second generally cylindrical interior volume having a second interior diameter disposed perpendicular to the central longitudinal axis. The at least one discharge section also includes at least one spacer defining a third generally cylindrical interior volume having a third interior diameter disposed perpendicular to the central longitudinal axis. The third interior diameter is different from the first or second interior diameter. The at least one discharge section is formed from the spacer arranged between the return electrode and the supply plate along the central longitudinal axis to define a generally cylindrical discharge gap for generating a plasma therein. The first, second and third interior volumes share the same central longitudinal axis in the discharge section.

In another aspect, a method of manufacturing a plasma source is provided. The method includes assembling at least one discharge section that comprises providing a return electrode defining a first generally cylindrical interior volume having a first interior diameter disposed perpendicular to a central longitudinal axis and providing a supply plate comprising a supply electrode. The supply plate defines a second generally cylindrical interior volume having a second interior diameter disposed perpendicular to the central longitudinal axis. Assembling at least one discharge section also comprises providing at least one spacer that defines a third generally cylindrical interior volume having a third interior diameter disposed perpendicular to the central longitudinal axis, where the third interior diameter is different from the first or second interior diameter, and locating the spacer between the return electrode and the supply plate along the central longitudinal axis to define a generally cylindrical discharge gap for generating a plasma therein. The first, second and third interior volumes share the same central longitudinal axis in the discharge section. The method further includes forming a body comprising an input port, an output port, and the at least one discharge section extending along the central longitudinal axis between the input port and the output port.

Any of the above aspects can include one or more of the following features. In some embodiments, the supply plate further comprises at least one dielectric member laterally surrounding the supply electrode. In some embodiments, the at least one dielectric member of the supply plate is a ring-shaped barrier dielectric member configured to laterally surround the supply electrode that is ring-shaped. In some embodiments, the at least one discharge section further comprises a ring-shaped isolation dielectric member positioned adjacent to the supply plate along the central longitudinal axis.

In some embodiments, the first interior diameter of the return electrode and the second interior diameter of the supply plate are substantially the same. In some embodiments, the third interior diameter of the spacer is larger than the first and second interior diameters, such that a portion of the interior volume of the spacer is laterally recessed relative to the return electrode and the supply plate. In some embodiments, the discharge gap is located in the recessed portion of the interior volume of the spacer. In some embodiments, the discharge gap is bounded longitudinally between a lateral surface of the return electrode and a lateral surface of the supply plate and bounded laterally by the spacer. In some embodiments, a discharge is formed within the discharge gap between the lateral surface of the return electrode and the lateral surface of the supply plate, the discharge current being adapted to flow parallel to the central longitudinal axis and perpendicular to the lateral surfaces. In some embodiments, a current density of the discharge current is substantially uniform around the central longitudinal axis.

In some embodiments, the return electrode is electrically grounded. In some embodiments, the at least one spacer of the discharge section comprises a plurality of spacers joined along the central longitudinal axis. In some embodiments, the spacer is made from an electrically non-conductive material.

In some embodiments, the body of the plasma source comprises a plurality of discharge sections arranged along the central longitudinal axis. In some embodiments, the plurality of discharge sections form a plurality of discontinuous discharge gaps along the central longitudinal axis for generating respective ones of plasmas. In some embodiments, the plurality of discharge gaps are substantially uniform.

In some embodiments, the return electrode, the supply plate and the at least one spacer are joined by one of co-firing or bonding.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the technology.

FIGS. 4a, 4b and 4c show sectional, exterior and exploded views, respectively, of another exemplary plasma source, according to some embodiments of the present invention.

DETAILED DESCRIPTION

In general, a plasma source described herein can include a dielectric barrier discharge structure for generating a localized plasma discharge. The dielectric barrier discharge structure can be formed by (i) a supply electrode, (ii) a return electrode located adjacent to the supply electrode, and (iii) a barrier dielectric material proximate to the supply electrode and return electrode, such as between the supply and return electrodes. A high-voltage alternative current can be supplied between the supply electrode and the return electrode to activate the dielectric barrier discharge structure, thereby generating a plasma localized within the dielectric barrier discharge structure. In some embodiments, the power of the resulting plasma is about 20 Watts to about 1000 Watts. Further, a supply electrode described herein generally refers to an electrode receiving a positive voltage, e.g., about 300 to about 2000 V, from a connected power supply. A return electrode generally refers to an electrode maintained at a lower voltage relative to the supply electrode. For example, the return electrode can be electrically grounded, floating (i.e., not connected to a power source), or biased to a negative voltage with respect to the supply electrode. In some embodiments, the supply electrode and the return electrode of a dielectric barrier discharge structure are both embedded in a barrier dielectric material, with the return electrode is either electrically grounded or not grounded (e.g., floating). In some embodiments, the supply electrode is embedded in a barrier dielectric material while the electrically-grounded return electrode is outside of the barrier dielectric material. A buried electrode assembly generally refers to a structure including a barrier dielectric material and having at least one of a return electrode or a supply electrode embedded in the barrier dielectric material.

Figure 1B:
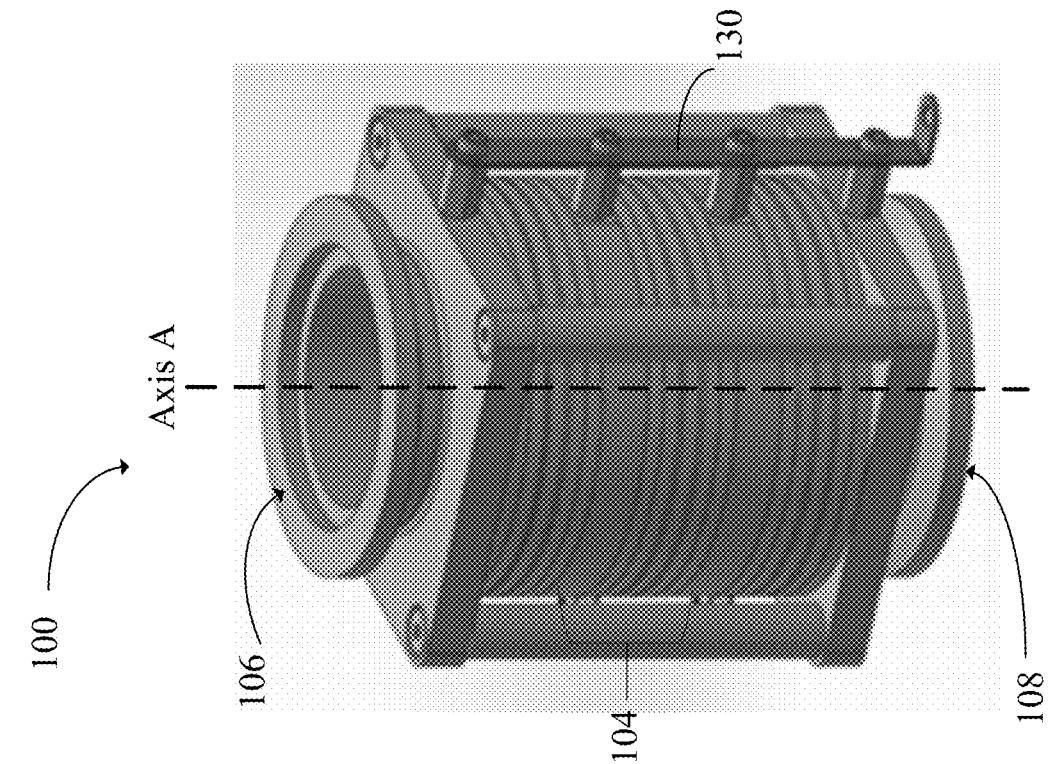
FIGS. 1a, 1b and 1c show sectional, exterior and exploded views, respectively, of an exemplary plasma source, according to some embodiments of the present invention.
Figure 1A:
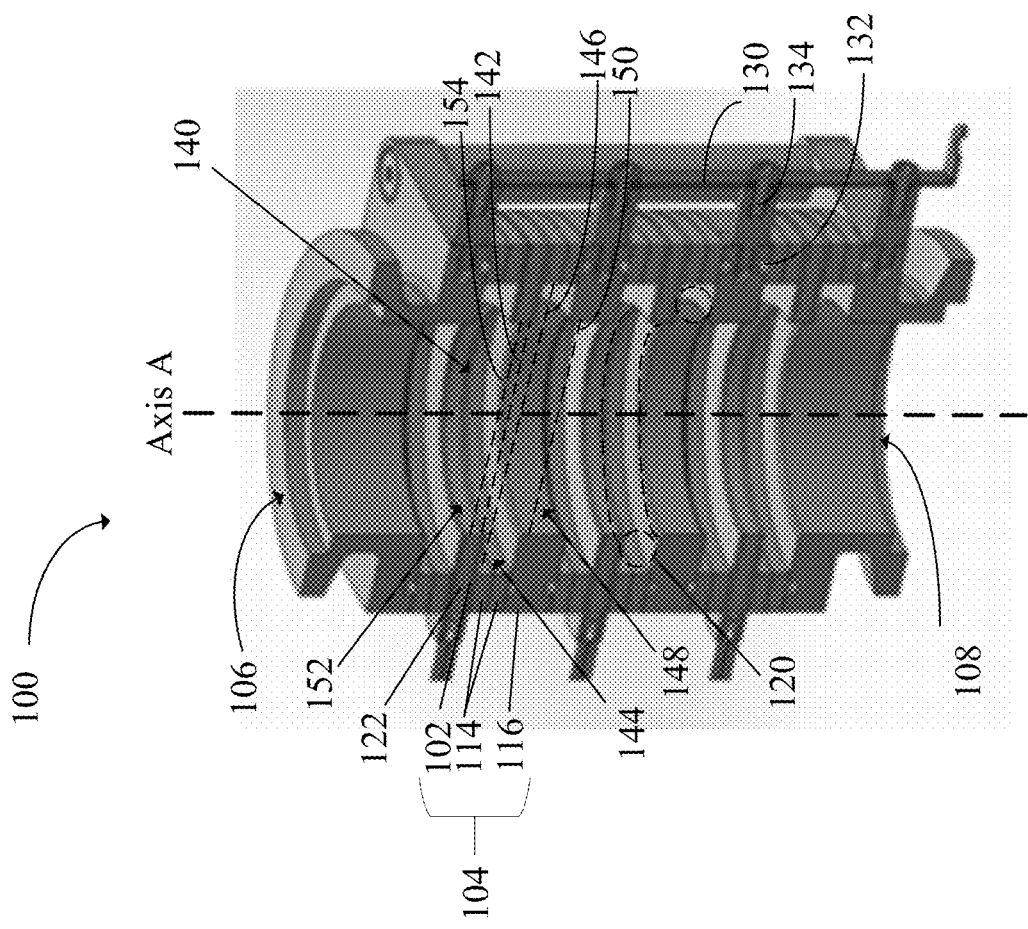
Figure 1C:
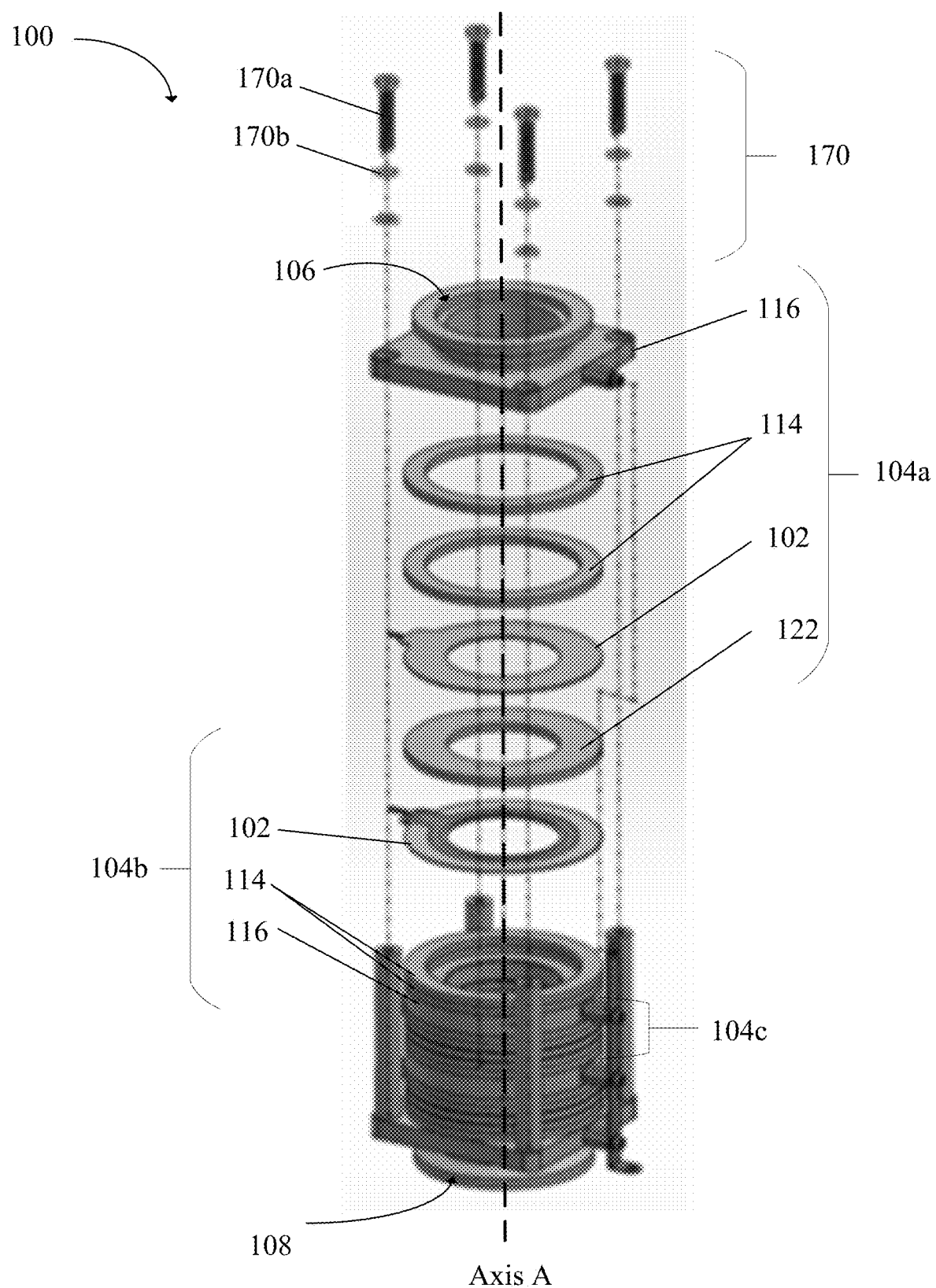

FIGS. 1a, 1b and 1c show sectional, exterior and exploded views, respectively, of an exemplary plasma source 100, according to some embodiments of the present invention. The plasma source 100 includes a body defining an input port 106, an output port 108, and at least one discharge section 104 extending along and disposed about a central longitudinal axis A between the input port 106 and the output port 108. Each discharge section 104 can include a return electrode 116, one or more spacers 114, a supply plate 102 and an optional isolation dielectric member 122 generally arranged in a stacked configuration along the longitudinal axis A.

Figure 2:
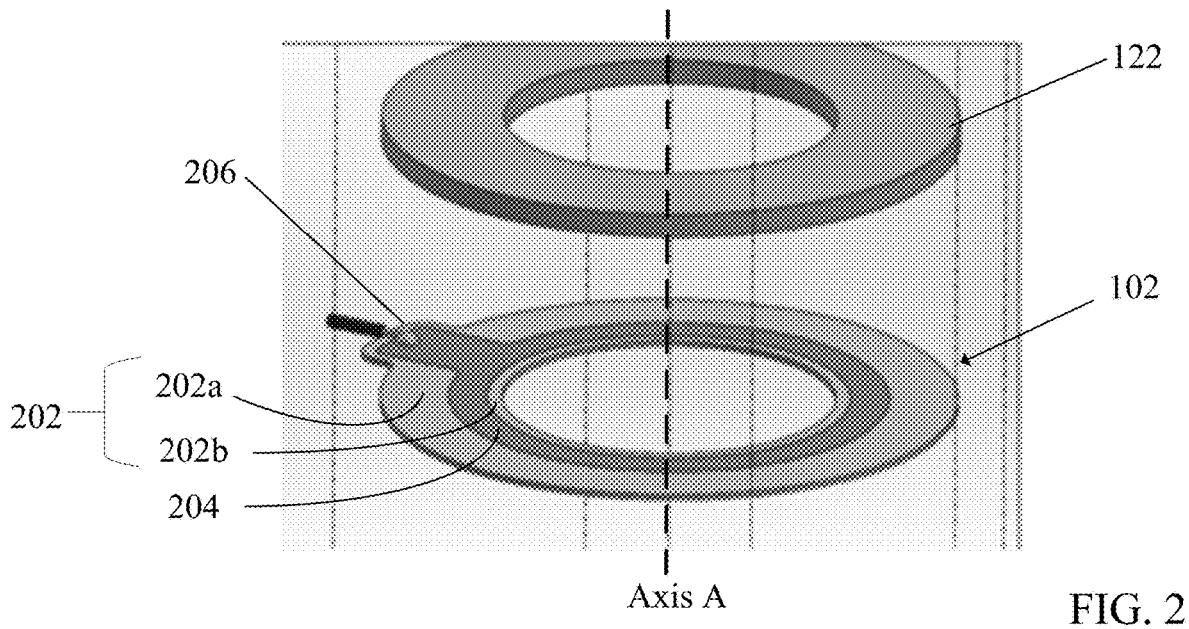
FIG. 2 shows an exemplary structure of the supply plate of the plasma source of FIGS. 1a-1c, according to some embodiments of the present invention.

In some embodiments, the supply plate 102 of each discharge section 104 has a generally cylindrical interior volume 140 that defines an interior diameter 142 perpendicular to the central longitudinal axis A. FIG. 2 shows an exemplary structure of the supply plate 102 of the plasma source 100 of FIGS. 1a-1c, according to some embodiments of the present invention. As shown, the supply plate 102 can be ring shape and can include a ring-shaped supply electrode 204 that is laterally/radially surrounded by at least one ring-shaped dielectric member 202. For example, an exterior ring-shaped dielectric member 202a can substantially surround an exterior circumference of the supply electrode 204 and/or an interior ring-shaped dielectric member 202b can substantially surround an interior circumference of the supply electrode 204. In some embodiments, a radial width of the interior ring-shaped dielectric member 202b is about 0.06 inches, such that the supply electrode 206 is set back from the inner circumference of the supply plate 102 by this width. Thus the supply electrode 204 can be radially sandwiched/buried between the two dielectric members 202. In some embodiments, one or both dielectric members 202a, 202b are present. In alternative embodiments, there is no dielectric member in the supply plate 102, in which case the supply plate 102 consists of only the supply electrode 204. Further, the supply plate 102 can include an outward-extending flange 206, which incorporates an outward-extending portion of the supply electrode 204, configured to establish electrical contact between the supply electrode 204 and a power supply (not shown). For example, during operation, a positive voltage, e.g., about 300 to about 2000 V, can be applied to the supply electrode 204 via the flange 206. The supply electrode 204 can be made from an electrically conductive material, e.g., copper. The dielectric member(s) 202 can be a barrier dielectric member constructed from an electrically non-conductive material, such as a ceramic material.

Referring back to FIGS. 1a-1c, each discharge section 104 also includes at least one spacer 114, which can be ring shaped and has a generally cylindrical interior volume 144 that defines an interior diameter 146 perpendicular to the central longitudinal axis A. In some embodiments, the interior diameter 146 of each spacer 114 is larger than the interior diameter 142 of the supply plate 102. In some embodiments, each spacer 114 is made from a non-electrically-conductive material, such as a ceramic material.

Each discharge section 104 can further include a return electrode 116, which can be ring shaped and has a generally cylindrical interior volume 148 that defines an interior diameter 150 perpendicular to the central longitudinal axis A. In some embodiments, the interior diameter 150 of each return electrode 116 is smaller than the interior diameter 146 of each spacer 114. In some embodiments, the interior diameter 150 of each return electrode 116 is about the same as the interior diameter 142 of each supply plate 102. The return electrode 116 can be made from an electrically conductive material, e.g., copper. In some embodiments, the return electrode 116 is electrically grounded.

In some embodiments, each discharge section 104 further includes an isolation dielectric member 122 positioned adjacent to the supply plate 102 of each discharge section 104, such as next to and in physical contact with the supply plate 102 along the longitudinal axis A. In some embodiments, the isolation dielectric member 122 is made from an electrically non-conductive material, e.g., a ceramic material. In some embodiments, as illustrated in FIGS. 1a-1c, each isolation dielectric member 122 is ring shaped and has a generally cylindrical interior volume 152 that defines an interior diameter 154 perpendicular to the central longitudinal axis A. The interior diameter 154 of each isolation dielectric member 122 can be about the same as the interior diameter 142 of a supply plate 102.

In an exemplary arrangement of a discharge section 104 of the plasma source 100 as shown in FIGS. 1a-1c, at least one spacer 114 is arranged in a stacked manner between the return electrode 116 and the supply plate 102 along the longitudinal axis A, such that the interior volumes 140, 144, 148 of the supply plate 102, spacer 114 and return electrode 116, respectively, are concentric and share the same central longitudinal axis A. Thus, at least one spacer 114 is longitudinally sandwiched between the return electrode 116 and the supply plate 102. In this configuration, since the interior diameter 146 of the spacer 114 is larger than the interior diameter 142 of the supply plate 102 and the interior diameter 150 of the return electrode 116 (where diameters 142 and 150 can be substantially the same), a portion of the interior volume 144 of the spacer 114 is radially recessed relative to the interior volumes 140, 148 of the supply plate 102 and the return electrode 116. This creates a ring-shaped recess region 120 within the interior volume 144 of the spacer 114 that can serve as a discharge gap for generating a plasma therein. Thus, the discharge gap 120 is bounded longitudinally between a lateral surface of the return electrode 116 and a lateral surface of the supply plate 102 and bounded laterally by an inner vertical surface the spacer 114. In some embodiments, more than one spacer 114 (e.g., two spacers 114 as shown in FIGS. 1a-1c) are stacked together along the central longitudinal axis A and sandwiched between the return electrode 116 and the supply plate 102 to enlarge the discharge gap 120 in each discharge section 104. In general the dimension of the discharge gap 120 can be adjusted by increasing or decreasing the number of spacers 114 present in the discharge section 104 and/or varying the length of the interior diameter 146 of each spacer 114.

Further, in the stacked arrangement of a discharge section 104, the isolation dielectric member 122 can be optionally positioned next to the supply plate 102 along the longitudinal axis A, such that the interior volumes 152, 140 of the dielectric member 122 and the supply plate 102 are substantially aligned and concentric. In this arrangement, one lateral surface of the supply plate 102 faces the discharge gap 120 while the opposite lateral surface of the supply plate 102 is in physical contact with the isolation dielectric member 122. Thus, the isolation dielectric member 122 and the supply plate 102 can form a buried electrode assembly, where the supply electrode 204 is buried between the barrier dielectric member(s) 202 of the supply plate 102 and the isolation dielectric member 122 neighboring the supply plate 102. In addition, each discharge section 104 can form a dielectric barrier discharge structure that includes (i) the buried electrode assembly comprising the supply electrode 204 embedded in the barrier dielectric member(s) 202 and the isolation dielectric member 122, and (ii) the return electrode 116 positioned outside of the buried electrode assembly (e.g., separated from the buried electrode assembly by the discharge gap 120).

Upon activation of a discharge section 104, a discharge current can be formed within each discharge gap 120 between a lateral surface of the return electrode 116 and a lateral surface of the supply plate 102. More particularly, the discharge current can flow parallel to the central longitudinal axis A between the lateral surfaces, thus in a direction substantially perpendicular to both of the lateral surfaces. In some embodiments, the current density of the discharge current in the discharge gap 120 is substantially uniform around the central longitudinal axis A, such that each discharge gap 120 is able to optimally utilize its full discharge area to generate substantially uniform current density. Because each discharge gap 120 is configured to uniformly distribute discharge current, structural erosion becomes more evenly distributed, which leads to a longer life for the plasma source 100. Further, even if the barrier discharge does erode through the supply plate 102, the return electrode 116 and/or the isolation dielectric member 122 of the buried electrode assembly in a discharge section 104, the integrity of the vacuum vessel is still maintained. In some embodiment, each discharge gap 120 is operated at a pressure of between 0.5 Torr and about 5 Torr.

In some embodiments, the plasma source 100 includes multiple discharge sections 104 arranged in a stacked manner (e.g., forming a series of stacked rings) along the central longitudinal axis A, where the discharge sections 104 are concentric and share the same central longitudinal axis A. The multiple discharge sections 104 are configured to form discrete, discontinuous localized plasmas in their respective discharge gaps 120. In some embodiments, the discharge gaps 120 of the multiple discharge sections 104 are substantially uniform in dimension (e.g., the same number/type of spacers 114 used) to generate substantially uniform regions of plasmas along the longitudinal axis A. In general, the more discharge sections are present in the plasma source 100, the higher power is produced by the plasma source 100. In some embodiments, as shown in FIGS. 1a-1c, the return electrodes 116 of the multiple discharge sections 104 are electrically connected via their respective electrical contacts 134 to a conductive bus bar 130 located proximate to the stacked discharge sections 104 and oriented substantially parallel to the longitudinal axis A. The bus bar 130 is configured to be in electrical communication with a power supply at one end, such that the bus bar 130 supplies substantially the same power to the multiple return electrodes 116 to either electrically ground these electrodes 116 or set them at a lower voltage relative to the supply electrodes 204.

In some embodiments, each of the input port 106 and output port 108 of the plasma source 100 is a part of a discharge section 104 of the plasma source 100. For example, the input port 106 can be a part of a return electrode 116 for a discharge section 104 at the input region of the plasma source 100 and the output port 108 can be a part of a return electrode 116 for another discharge section 104 at the output region of the plasma source 100. The interior diameter of each of the input and output ports 106, 108 can be about the same as the interior diameter 142 of a supply plate 102, the interior diameter 154 of an isolation dielectric member 122 and/or the interior diameter 150 of a return electrode 116. In some embodiments, the input port 106, which is located at one end of the plasma source body along the longitudinal axis A, is configured to couple to an input pumping line segment (not shown). The output port 108 can be located at the opposite end relative to the input port 106 along the longitudinal axis A for coupling to an output pumping line segment (not shown). Thus, once the plasma source 100 is connected to the input pumping line segment at the input port 106 and the output pumping line segment at the output port 108, the plasma source 100 becomes a segment of the overall pumping line. In addition, a generally constant pumping speed and/or conductance can be maintained throughout the resulting connected pumping line structure regardless of whether the fluid is traveling through the pumping line segments or the plasma source 100. In some embodiments, the interior diameter 154 of the isolation dielectric member 122, the interior diameter 142 of the supply plate 102, the interior diameter 150 of the return electrode 116 and the interior diameter of the input and output ports 106, 108, are about the same as the interior diameter of the input and output pumping line segments to which to plasma source 100 is connected. Further, each discharge gap 120 extends radially outward, i.e., has a larger interior diameter, relative to the interior diameter of the pumping line segments.

In operation, as a cleaning gas flows from the pumping line into the plasma source 100 in a flow path that is parallel to the longitudinal axis A, the discharge section(s) 104 in the plasma source 100 can be activated to generate a discharge current in the discharge gap 120 of each discharge section 104, where the discharge current is adapted to dissociate the gas in the flow path to generate a localized plasma discharge in each discharge gap 120. To activate the one or more discharge sections 104, the supply plates 104 can be supplied with a voltage via their respective flanges 206 and the return electrodes 116 can be floating or electrically grounded/set to a lower voltage via their connections 134 to the bus bar 130. As described above, the resulting discharge current in each discharge section 104 can be substantially parallel to and uniformly distributed about the longitudinal axis A. In some embodiments, the plasma discharge can have a power of about 20 Watts to about 1000 Watts. Each localized plasma discharge is adapted to fill most of the volume of the corresponding discharge gap 120, thereby maintaining a generally toroidal shape about the longitudinal axis A. Radicals generated in the discharge gap(s) 120 of the plasma source 100 can be brought into the flow path through diffusion or turbulence. In some embodiments, the discharge current partially dissociates the gas in the flow path, and the power level used to activate the discharge section(s) 104 is selected to be reduced to reduce heating and increase lifetime of the plasma source 100. Partial dissociation of the input gas can produce a sufficient amount of radical species of the gas to produce acceptable cleaning results of the pumping line segments.

Figure 3:
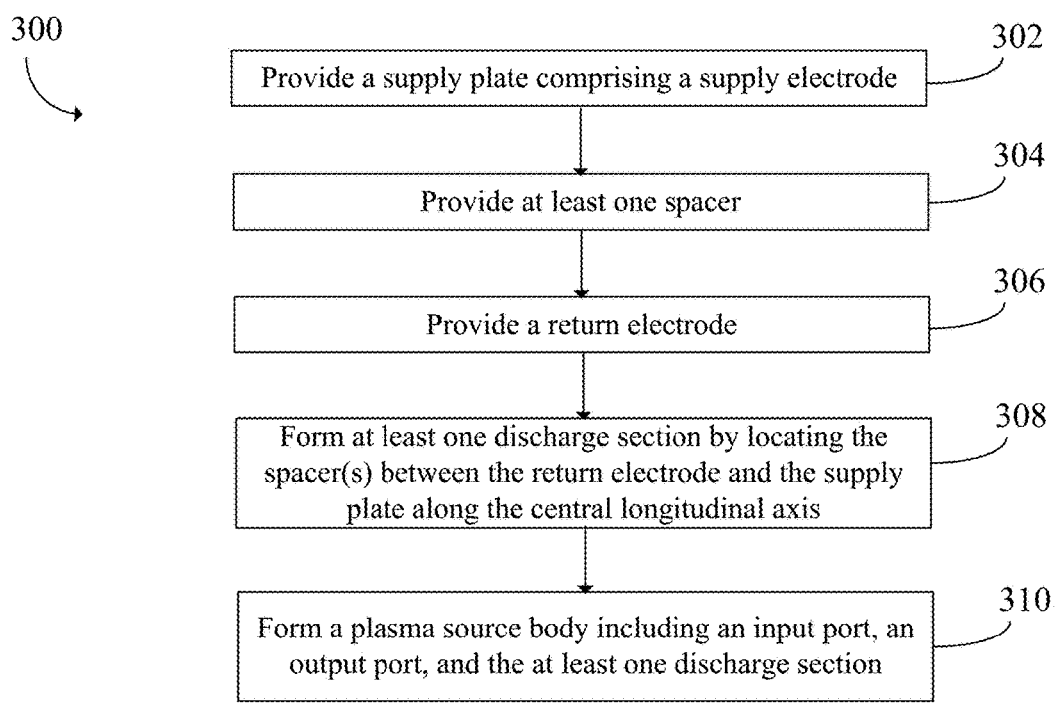
FIG. 3 shows an exemplary process for assembling the plasma source of FIGS. 1a-1c, accordingly to some embodiments of the present invention.

FIG. 3 shows an exemplary process 300 for assembling the plasma source 100 of FIGS. 1a-1c, accordingly to some embodiments of the present invention. A discharge section 104 of the plasma source 100 is assembled by first providing (i) a supply plate 102 at step 302, (ii) one or more spacers 114 at step 304, and (iii) and a return electrode 116 at step 306. In some embodiments, the interior diameter 146 of each spacer 114 is larger than the interior diameters 142, 150 of the supply plate 102 and the return electrode 116. In some embodiments, the interior diameters 142, 150 of the supply plate 102 and the return electrode 116 are substantially the same. In some embodiments, an isolation dielectric member 122 is additionally provided with an interior diameter 154 that is about the same as that of the supply plate 102.

At step 308, a discharge section 104 is formed by stacking together the return electrode 116, the spacer(s) 114, the supply plate 102, and optionally the isolation dielectric member 122 along the longitudinal axis A. For example, the spacer(s) 114 can be sandwiched between the return electrode 116 and the supply plate 102 to define a generally ring-shaped discharge gap 120 for generating a plasma therein. Upon activation, the discharge gap 120 can generate a discharge current between the lateral surfaces of the return electrode 116 and the supply plate 102, where the discharge current is adapted to flow generally parallel to the central longitudinal axis A and perpendicular to the lateral surfaces. In some embodiments, the isolation dielectric member 122 is located next to the supply plate 102 along the longitudinal axis A such that the supply plate 102 is sandwiched between the spacer(s) 114/discharge gap 120 on one side and the isolation dielectric member 122 on the opposite side. In this stacked arrangement, the inner diameters of the stacked components are concentric and share the same central longitudinal axis A.

In some embodiments, multiple discharge sections 104 can be assembled and stacked along the central longitudinal axis A in the plasma source 100 if, for example, a higher powered system is needed. In an exemplary stacked arrangement of multiple discharge sections 104, an end component of one discharge section 104 can be shared with another discharge section 104. For instance, as shown in FIG. 1c, the isolation dielectric member 122 can be used by both discharge sections 104a, 104b, which means that the discharge sections 104a, 104b are stacked in a back-to-back fashion. In addition, an intermediate return electrode 116 can be shared by two discharge sections 104b, 104c. In general, the multiple discharge sections 104 form respective ones of discontinuous discharge gaps 120 along the central longitudinal axis A for generating respective ones of discharge current used to dissociate an input gas, thereby producing localized plasmas in the respective discharge gaps 120.

Further, at step 310, an input port 106 and an output port 108 are disposed at the ends of the plasms source 100 with the discharge section(s) 104 extending along the central longitudinal axis A between the two ports 106, 108. The ports 106, 108 can be suitably configured to connect the plasma source 100 between two pumping line segments such that the plasma source 100 becomes a part of the overall pumping line. Further, each of the input port 106 and the output port 108 can serve as a return electrode 116 of a discharge section 104.

The plasma source configuration 100 described above with reference to FIGS. 1a-1c, 2 and 3 are merely illustrative. Variations in form and detail may be made without departing from the spirit and scope of the present invention. In one example, the components that are designated supply electrode(s) and return electrode(s) in the plasma source 100 can reverse in polarity (if the return electrode(s) are electrically floating) so that the supply electrodes can function as the return electrodes and vice versa while still preserving substantially the same plasma generation capability. In some embodiments, the stacked components of the plasma source 100 are joined by a co-firing technique. For example, the barrier dielectric material and/or the isolation dielectric material can be ceramic and formed in a "green state" (e.g., at room temperature). Then, at least one high-temperature metal element with similar coefficient of thermal expansion as the ceramic material(s) of the barrier dielectric and/or the isolation dielectric can be patterned onto the ceramic material(s). The high-temperature metal can serve as the supply electrode 204 of the buried electrode assembly. The resulting structure is pressed and co-fired at high temperature, e.g., about 1550 Celsius to about 2000 Celsius, to form a unitary structure. In some embodiments, the stacked components are joined by bonding using, for example, Ablestik 563 epoxy. In some embodiments, an O-ring seal 132 (as shown in FIG. 1a) is used to seal a spacer 114 to a return electrode 116 when assembling a discharge section 104. In some embodiments, as illustrated in FIG. 1c, a load structure 170 is provided for axial compression of the stacked plasma source 100, including providing appropriate compression of the O-ring seals 132. For example, the load structure 170 can be a bolted arrangement using one or more bolts 170a and springs and/or spring washers 170b to ensure consistent mechanical compression.

Figure 4C:
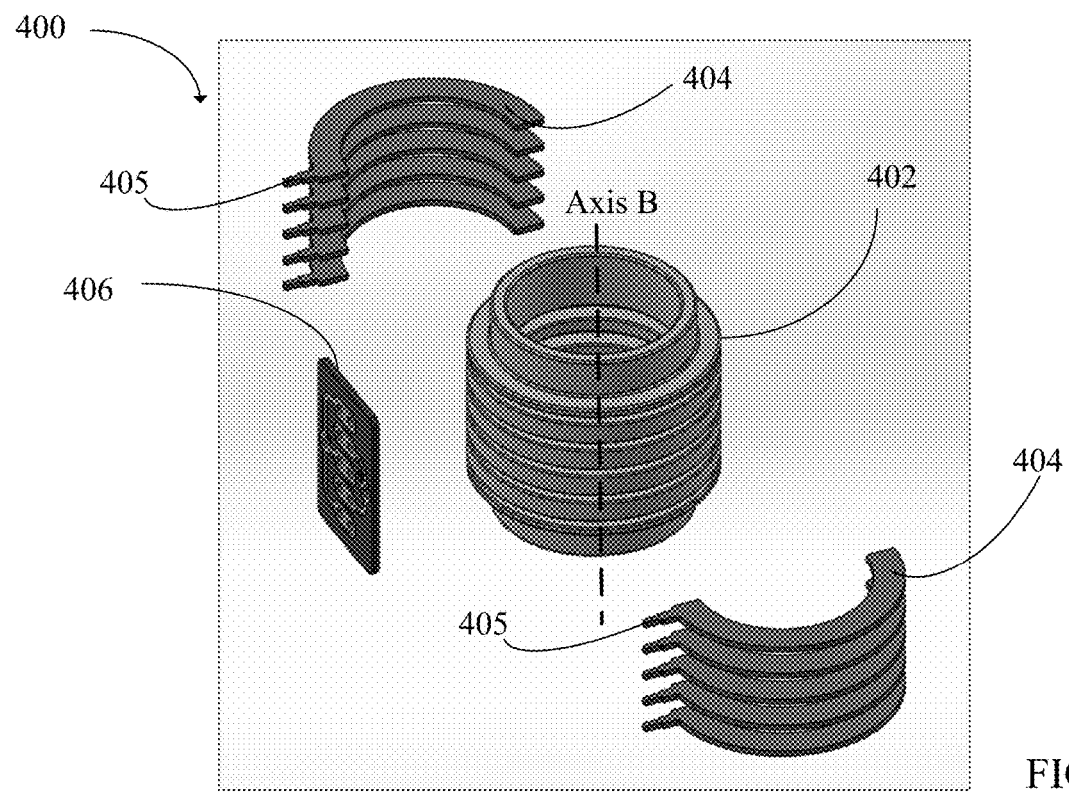

FIGS. 4a, 4b and 4c show sectional, exterior and exploded views, respectively, of another exemplary plasma source 400, according to some embodiments of the present invention. In general, the plasma source 400 has substantially the same function and configuration as the plasma source 100 of FIGS. 1a-1c, but with fewer individual components for assembly to form the resulting plasma source structure. As shown, in FIG. 4b, the plasma source 400 generally includes a plasma source body 402 made from an electrically non-conductive material, such as a ceramic material (e.g., aluminum oxide or aluminum nitride), stacks of electrode plates 404 made from an electrically conductive material, such as copper, and an interconnect printed circuit board (PCB) 406.

Figure 5:
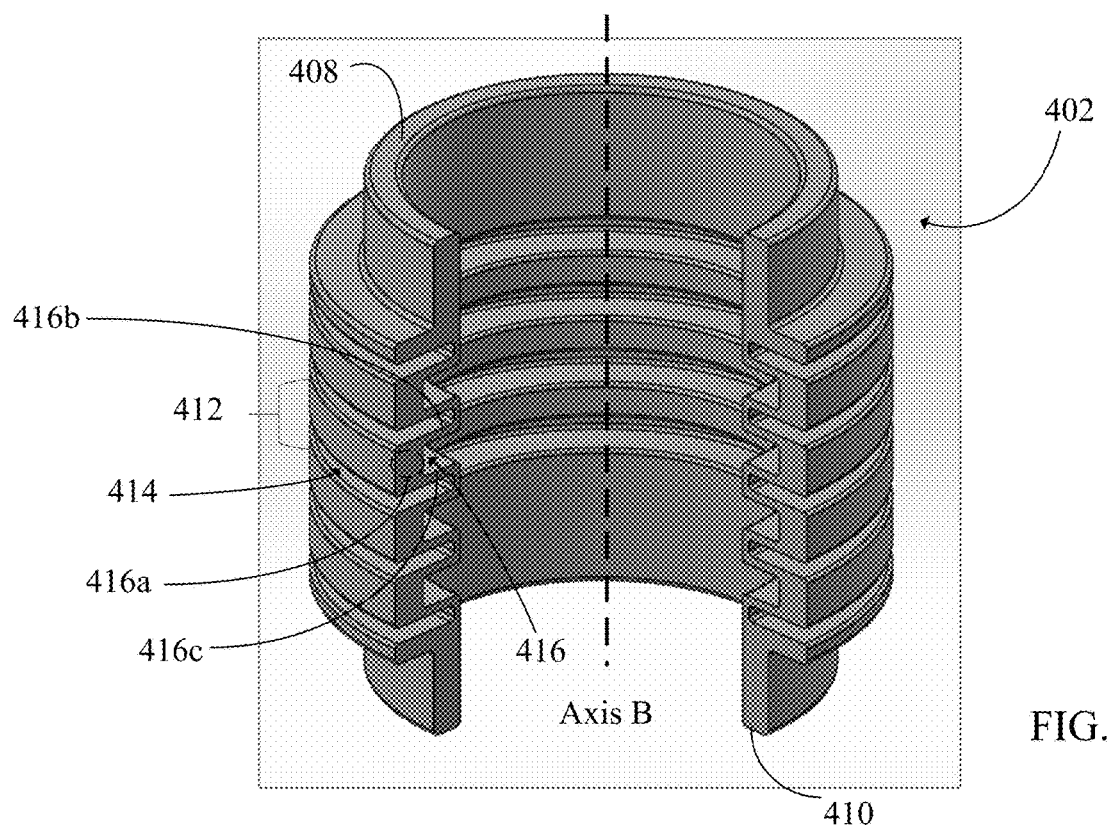
FIG. 5 shows an exemplary configuration of the body of the plasma source of FIGS. 4a-4c, according to some embodiments of the present invention.

The plasma source body 402 generally encapsulates the multiple non-conductive (e.g., ceramic) components of the plasma source 100 of FIGS. 1a-1c into one monolithic structure. For example, instead of having separate and distinct return electrodes 116, spacers 114, barrier dielectric members 202 and isolation dielectric members 122, which can all be electrically non-conductive, they are formed into a single structure. FIG. 5 shows an exemplary configuration of the body 402 of the plasma source 400 of FIGS. 4a-4c, according to some embodiments of the present invention. As shown, the plasma source body 402 defines a monolithic structure that extends between an input port 408 and an output port 410 along a central longitudinal axis B. In some embodiments, the input port 408 and output port 410 have substantially the same configuration and function as the input port 106 and output port 108, respectively, of the plasma source 100 of FIGS. 1a and 1b. Similar to plasma source 100, the plasma source body 402 of the plasma source 400 defines one or more discharge sections 412 extending longitudinally between the input port 408 and the output port 410.

In some embodiments, each discharge section 412 includes an exterior slot 414 disposed into the plasma source body 402 and recessed relative to the exterior surface of the plasma source body 402. The exterior slot 414 can be ring shaped and can orient perpendicular to the longitudinal axis B. The exterior slot 414 is configured to receive a pair of the electrode plates 404, where each plate 404 has a half-ring shape with an outward extending flange 405. Thus, two electrode plates 404 are configured to fit into each exterior slot 414 to form a complete ring-shaped supply electrode within the corresponding slot 414. The extending flanges 405 of the two electrode plates 404 are adapted to extend outward from the exterior surface of the plasma source body 502, where the flanges 405 of the pair of electrode plates 404 are configured to receive a voltage from an external power supply (not shown). The combination of (i) the electrode plates 405 and (ii) the non-conductive dielectric material of the body 402 that defines the slot 414 and surrounds the electrode plates 404 form a buried electrode assembly similar to the buried electrode assembly of a discharge section 104 of the plasma source 100 described above with reference to FIGS. 1a-1c. More specifically, this combination is equivalent to the supply plate 102 and the one or more isolation dielectric members 122 adjacent to the supply plate 102 within the plasma source 100. In some embodiments, instead of using two half ring-shaped electrode plates 404 to form one complete ring-shaped supply electrode, a single ring-shaped electrode plate is used.

In some embodiments, each discharge section 412 of the plasma source body 402 further includes an interior slot 416 disposed into the plasma source body 402 and recessed relative to the interior surface of the plasma source body 402. The interior slot 416 can be ring shaped and can orient perpendicular to the longitudinal axis B. The interior slot 416 is positioned adjacent to (e.g., next to) the exterior slot 414 along the longitudinal axis B within a discharge section 412. Each interior slot 416 defines a ring-shaped discharge gap substantially the same as a discharge gap 120 of the plasma source 100 of FIGS. 1a-1c. More specifically, the vertical wall section 416a of the interior slot 416, which laterally bounds the discharge gap, can be equivalent to the one or more spacers 114 of the plasma source 100. The discharge gap is also bounded longitudinally between (i) a lateral wall section 416b of the interior slot 416 that can be equivalent to a return electrode 116 of the plasma source 100 and (ii) another lateral wall section 416c of the interior slot 416 that can be equivalent to a portion of the supply plate 102 of the plasma source 100. Similar to the discharge gap 120 of the plasma source 100, a discharge current can be formed within the discharge gap 416 between the lateral walls 416b, 416c. The discharge current is adapted to flow parallel to the central longitudinal axis B and perpendicular to the lateral walls 416b, 416c. The current density associated with this discharge current is substantially uniform around the central longitudinal axis B.

In some embodiments, the plasma source body 402, along with the electrode plates 404, define multiple discharge sections 412 within the plasma source 400. The interconnect PCB 406 of the plasma source 400, which is located adjacent to the plasma source body 402, can be configured to electrically interconnect the flanges 405 of the electrode plates 404 of the discharge sections 412. More specifically, the interconnect PCB 406 can be in electrical communication with a power supply (not shown) and configured to provide the same voltage to all of the interconnected electrode plates 404 via their respective flanges 405. In some embodiments, the plasma source body 402 is electrically grounded.

To assemble the plasma source 400, the electrode plates 404 are first inserted into their respective exterior slots 414 within the plasma source body 402. After the electrode plates 404 are in position (e.g., secured with a potting material), the flanges 405 of the electrode plates 404 are suitably attached to the interconnect PCB 406. To activate the discharge section(s) 412 of the plasma source 400, a voltage is applied to the electrode plates 404 via the interconnect PCB 406, which generates a discharge current within the discharge gap(s) 416 (i.e., the interior slot(s)) of the plasma source body 402 that is adapted to dissociate an input gas supplied to the plasma source 400 via the input port 408.

Figure 6:
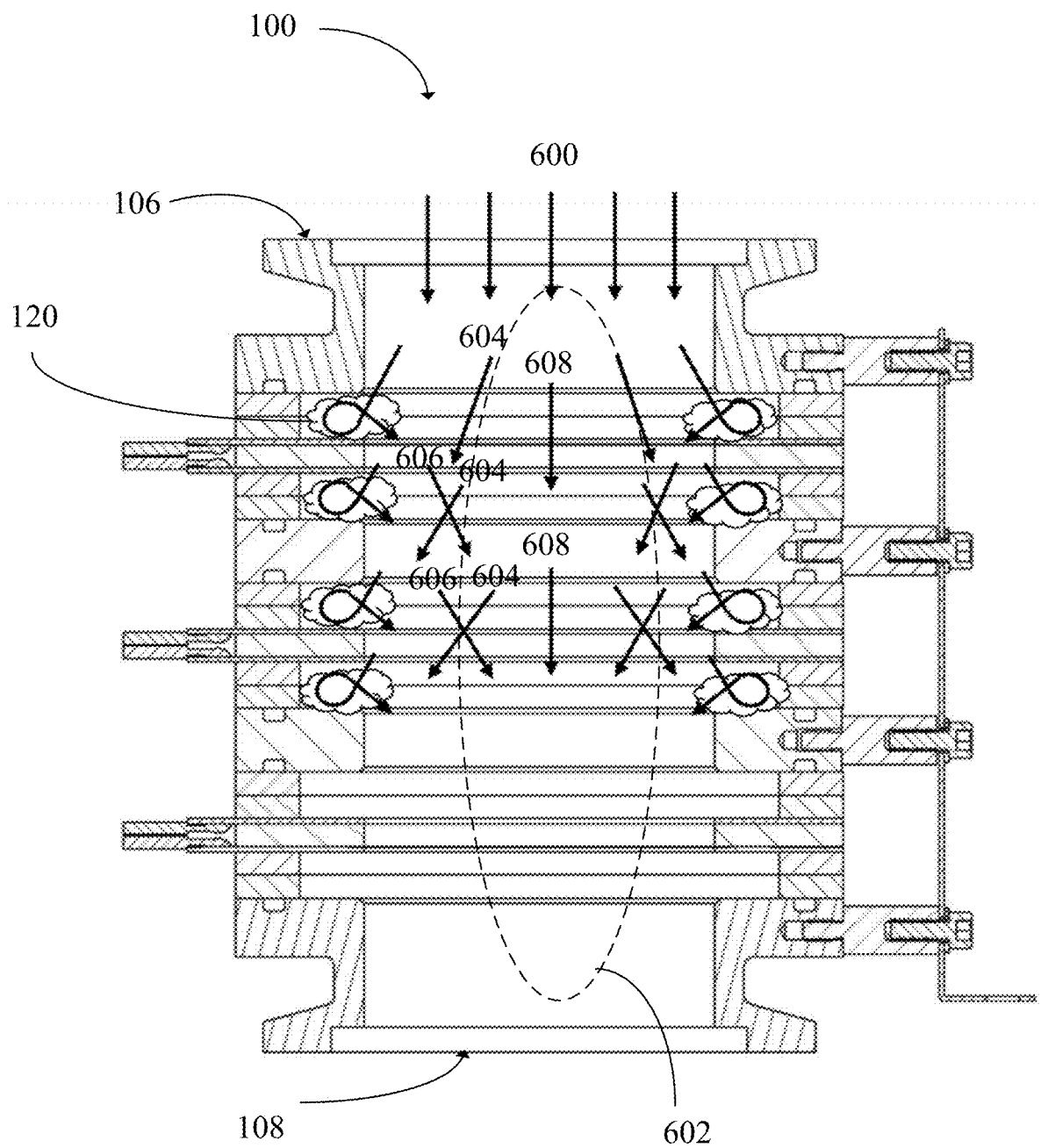
FIG. 6 shows an exemplary gas flow pattern maintained in the interior volume of the plasma source of FIGS. 1a-c, according to some embodiments of the present invention.

In another aspect, the plasma sources described herein can form an inline connection with one or more pumping line segments in a semiconductor processing system, where each inline plasma source provides an interior volume that allows a gas from the pumping line to flow therethrough without altering the pumping speed and/or conductance along the pumping line. Localized plasmas can be formed in one or more discontinuous discharge gaps in the interior volume of each plasma source to dissociate the gas flow therein. FIG. 6 shows an exemplary gas flow pattern maintained in the interior volume of the plasma source 100 of FIGS. 1a-c, according to some embodiments of the present invention. Even though FIG. 6 is explained with respect to the plasma source 100 of FIG. 1a-c, substantially the same flow pattern can be maintained in the interior volume of the stacked plasma source 400 of FIGS. 4a-c. As shown, a gas flow 600 is provided to the input port 106 of the plasma source 100. A substantial portion 608 of the gas flow 600 proceeds to travel through the open, high conductance central region 602 in the interior volume of plasma source 100 from the input port 106 to the output port 108. However, mixing through diffusion and turbulence can occur within the interior volume of the plasma source 100 that brings un-dissociated gas 604 from the central flow region 602 into the discharge gaps 120 of the plasma source 100 for dissociation. The mixing can also bring dissociated, atomic radicals 606 from the discharge gaps 120 into the central flow region 602 for conveyance to the output port 108. Such mixing and dissociation can occur at every discharge gap 120 in the stacked configuration of the plasma source 100. In some embodiments, the plasma sources described herein can be used to clean a CVD system, where one or more of the plasma sources are positioned downstream from a processing chamber and coupled in-line with a pumping line. In some embodiments, the plasma sources described herein are compatible with the cleaning systems and methods described in U.S. patent application Ser. No. 17/107,146, which is owned by the assignee of the instant application and incorporated by reference in its entirety.

While the invention has been particularly shown and described with reference to specific embodiments, it should be understood by those skilled in the art that various changes in form and detail may be made therein without departing from the spirit and scope of the invention as defined by the appended claims.

What is claimed is:

1. A plasma source comprising: a body defining an input port, an output port, and at least one discharge section extending along a central longitudinal axis between the input port and the output port, the at least one discharge section including: a return electrode defining a first generally cylindrical interior volume having a first interior diameter disposed perpendicular to the central longitudinal axis; a supply plate comprising a supply electrode, the supply plate defining a second generally cylindrical interior volume having a second interior diameter disposed perpendicular to the central longitudinal axis; and at least one spacer defining a third generally cylindrical interior volume having a third interior diameter disposed perpendicular to the central longitudinal axis, the third interior diameter larger than the first and second interior diameters, such that a portion of the interior volume of the at least one spacer is laterally recessed relative to the return electrode and the supply electrode; wherein the at least one discharge section is formed from the at least one spacer arranged between the return electrode and the supply plate along the central longitudinal axis to define a ring-shaped discharge gap for generating a plasma therein, the discharge gap located in the recessed portion of the interior volume of the at least one spacer, and wherein the first, second and third interior volumes share the same central longitudinal axis in the at least one discharge section.

2. The plasma source of claim 1, wherein the return electrode is electrically grounded.

3. The plasma source of claim 1, wherein the supply plate further comprises at least one dielectric member laterally surrounding the supply electrode.

4. The plasma source of claim 3, wherein the at least one dielectric member of the supply plate is a ring-shaped barrier dielectric member configured to laterally surround the supply electrode that is ring-shaped.

5. The plasma source of claim 1, wherein the at least one discharge section further comprises a ring-shaped isolation dielectric member positioned adjacent to the supply plate along the central longitudinal axis.

6. The plasma source of claim 1, wherein the first interior diameter of the return electrode and the second interior diameter of the supply plate are substantially the same.

7. The plasma source of claim 1, wherein the discharge gap is bounded longitudinally between a lateral surface of the return electrode and a lateral surface of the supply plate and bounded laterally by the at least one spacer.

8. The plasma source of claim 7, wherein a discharge current is formed within the discharge gap between the lateral surface of the return electrode and the lateral surface of the supply plate, the discharge current being adapted to flow parallel to the central longitudinal axis and perpendicular to the lateral surfaces.

9. The plasma source of claim 8, wherein a current density of the discharge current is substantially uniform around the central longitudinal axis.

10. The plasma source of claim 1, wherein the at least one spacer of the discharge section comprises a plurality of spacers joined along the central longitudinal axis.

11. The plasma source of claim 1, wherein the body of the plasma source comprises a plurality of discharge sections arranged along the central longitudinal axis.

12. The plasma source of claim 11, wherein the plurality of discharge sections form a plurality of discontinuous discharge gaps along the central longitudinal axis for generating respective ones of plasmas.

13. The plasma source of claim 12, wherein the plurality of discharge gaps are substantially uniform.

14. The plasma source of claim 1, wherein at least one of the return electrode, the supply plate or the at least one spacer is formed by one of co-firing or bonding.

15. The plasma source of claim 1, wherein the at least one spacer is made from an electrically non-conductive material.

16. A method of manufacturing a plasma source, the method comprising: assembling at least one discharge section comprising: providing a return electrode defining a first generally cylindrical interior volume having a first interior diameter disposed perpendicular to a central longitudinal axis; providing a supply plate comprising a supply electrode, the supply plate defining a second generally cylindrical interior volume having a second interior diameter disposed perpendicular to the central longitudinal axis; providing at least one spacer that defines a third generally cylindrical interior volume having a third interior diameter disposed perpendicular to the central longitudinal axis, the third interior diameter larger than the first and second interior diameters, such that a portion of the interior volume of the at least one spacer is laterally recessed relative to the return electrode and the supply electrode; and locating the spacer between the return electrode and the supply plate along the central longitudinal axis to define a ring-shaped discharge gap for generating a plasma therein, the discharge gap located in the recessed portion of the interior volume of the spacer, wherein the first, second and third interior volumes share the same central longitudinal axis in the at least one discharge section; and forming a body comprising an input port, an output port, and the at least one discharge section extending along the central longitudinal axis between the input port and the output port.

17. The method of claim 16, further comprising electrically grounding the return electrode.

18. The method of claim 16, wherein the supply plate further comprises at least one dielectric member laterally surrounding the supply electrode.

19. The method of claim 16, wherein assembling the at least one discharge section further comprises providing a ring-shaped isolation dielectric member and positioning the isolation dielectric member adjacent to the supply plate along the central longitudinal axis.

20. The method of claim 16, wherein the discharge gap is bounded longitudinally between a lateral surface of the return electrode and a lateral surface of the supply plate and bounded laterally by the spacer.

21. The method of claim 20, further comprising:
generating a discharge current within the discharge gap between the lateral surface of the return electrode and the lateral surface of the supply plate; and
flowing the discharge current generally parallel to the central longitudinal axis and perpendicular to the lateral surfaces.

22. The method of claim 21, wherein a density of the discharge current is substantially uniform around the central longitudinal axis.

23. The method of claim 16, further comprising:
assembling a plurality of discharge sections;
and arranging the plurality of discharge sections along the central longitudinal axis between the input port and the output port to form the body of the plasma source.

24. The method of claim 23, further comprising forming a plurality of discontinuous discharge gaps by the plurality of discharge sections along the central longitudinal axis for generating respective ones of plasmas.

25. The method of claim 16, further comprising forming at least one of the return electrode, the supply plate or the at least one spacer by one of co-firing or bonding to assemble the at least one discharge section.

26. The method of claim 16, wherein the spacer is made from an electrically non-conductive material.

* * * * *